United States Patent [19]

Kato et al.

[11] 4,164,704

[45] Aug. 14, 1979

[54] PLURAL PROBE CIRCUIT CARD FIXTURE USING A VACUUM COLLAPSED MEMBRANE TO HOLD THE CARD AGAINST THE PROBES

[75] Inventors: Makoto Kato, Santa Ana; Larry N. Velie, El Toro; John L. Baverstock, Long Beach, all of Calif.

[73] Assignee: Metropolitan Circuits, Inc., Costa Mesa, Calif.

[21] Appl. No.: 737,343

[22] Filed: Nov. 1, 1976

[51] Int. Cl.² .................... G01R 15/12; G01R 31/02
[52] U.S. Cl. ............................ 324/73 PC; 324/72.5; 324/158 F; 324/158 P
[58] Field of Search ............. 324/72.5, 73 PC, 158 F, 324/158 P; 339/255 R, 108 TP

[56] References Cited

U.S. PATENT DOCUMENTS

| | | | |
|---|---|---|---|
| 2,916,723 | 12/1959 | Cronin | 339/255 R |
| 3,416,125 | 12/1968 | Theve | 339/255 R |
| 3,437,984 | 4/1969 | Yorgensen | 339/255 R |
| 3,654,585 | 4/1972 | Wickersham | 324/158 F |
| 3,723,867 | 3/1973 | Canarutto | 324/73 PC |
| 3,757,219 | 9/1973 | Aksu | 324/158 F |
| 3,996,516 | 12/1976 | Luther | 324/158 F |
| 4,017,793 | 4/1977 | Haines | 324/73 PC |

OTHER PUBLICATIONS

Till, A. W.; Contact Probe-IBM Tech. Bull., vol. 16, No. 10, Mar. 1974, pp. 3224–3225.

*Primary Examiner*—Robert J. Corcoran
*Attorney, Agent, or Firm*—Jackson, Jones & Price

[57] ABSTRACT

A test fixture for circuit cards comprising a probe board bearing electrical test probes in a fixed position with respect to the overlying test surface. A flexible sheet is supported by the probes and serves to stabilize their relative positions. The circuit card is held against the probes by vacuum force applied utilizing a thin plastic layer overlying the circuit card. The test probe utilized in the test fixture has a conductive shaft tapering to a cylindrical tip on which a conductive spring and a conductive contact cap are slidably mountable. The cap is tapered down to the tip, and the spring is designed to engage both the tapered portions of the cap and of the shaft. A twisting motion of the cap causes the spring to electrically and physically connect the cap and the shaft. The cap also an indentation for interlocking with the flexible sheet of the test fixture.

4 Claims, 4 Drawing Figures

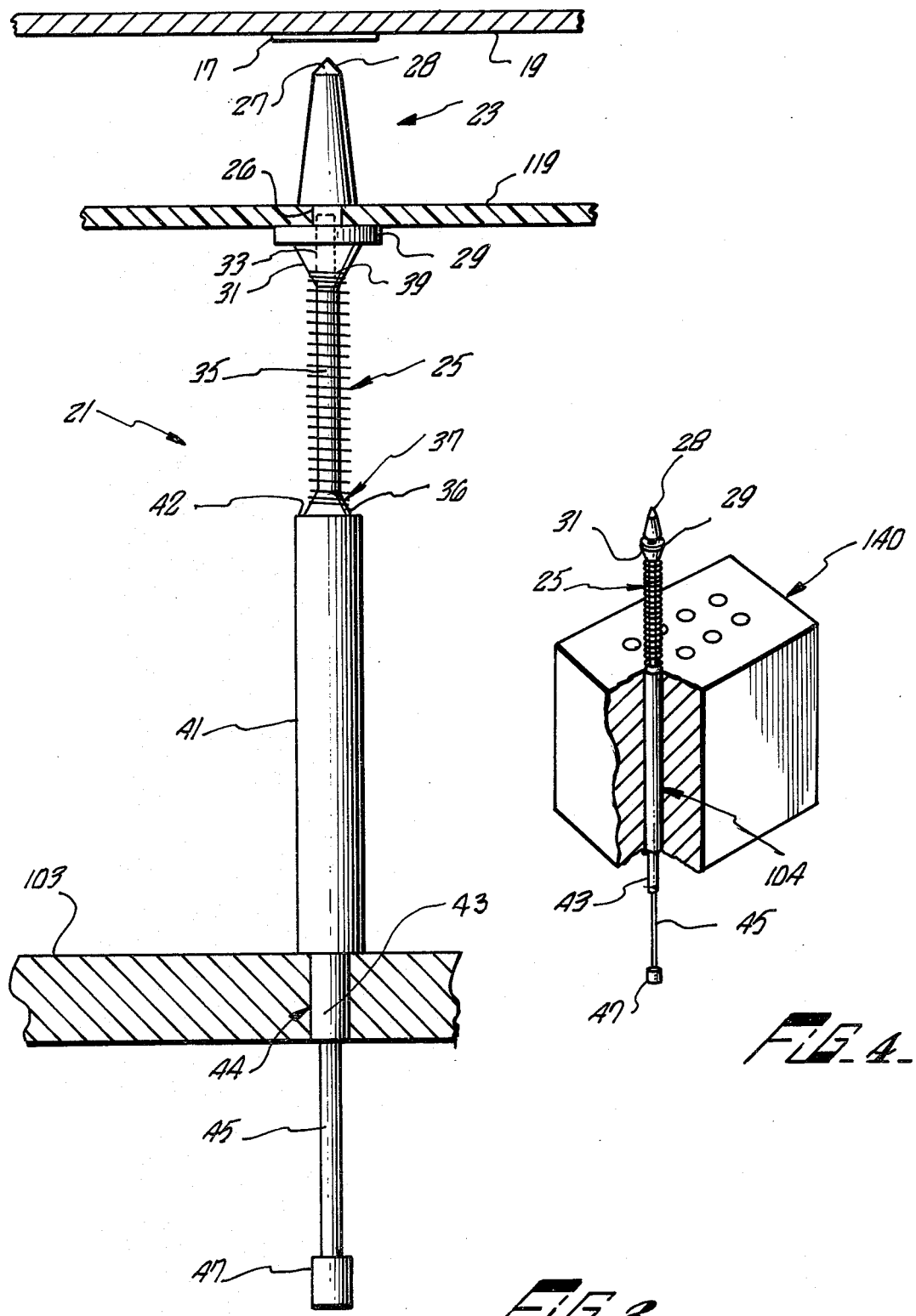

PLURAL PROBE CIRCUIT CARD FIXTURE USING A VACUUM COLLAPSED MEMBRANE TO HOLD THE CARD AGAINST THE PROBES

BACKGROUND OF THE INVENTION

The subject invention relates to circuit card testing apparatus and to a test probe assembly for use in such apparatus. More particularly, the subject invention relates to a minimum cost circuit card test apparatus wherein miniature test probes normally protrude from the surface of the apparatus to make contact with conductive test points of a circuit card held against the probes by force. Additionally the invention relates to a minimum cost test probe which finds use in such apparatus.

Prior art circuit card testers are known wherein a circuit card is mounted on the top surface bed board of a test fixture housing. In one prior art tester, the bed board has several small holes underlying the circuit board. The housing is closed by a lower baseboard which is movable with respect to the top bed board. A vacuum is created in the enclosed cavity between the bed board and the baseboard. The vacuum works through the bed board holes to retain the circuit card on the bed board and forces the movable baseboard toward the bed board. As the movable baseboard progresses toward the bed board, appropriate test probes mounted on the baseboard rise through corresponding apertures in the bed board and are forced into contact with conductive test points on the undersurface of the circuit card.

In conjunction with such circuit card testers of the prior art, spring loaded electrical probes of the plunger type have previously been used. An example of such a contact is illustrated in U.S. Pat. No. 3,435,168. In the plunger type of contact, the contact tip is mounted on a cylindrical plunger which fits into the interior of a base tube. A spring in the interior of the tube provides a force for biasing the contact tip to a test point.

While elegant in design, prior art circuit card testers and their associated contact pins have proved inordinately expensive. This expense is aggravated by the fact that it is often necessary to scrap expensive portions of such circuit testing equipment when the circuit card which they are designed to test is replaced by a new circuit card with a different test point pattern.

A major contributor to the excessive cost of the prior art circuit card test equipment has been the electrical probes associated therewith. This cost factor has become increasingly aggravated as the number of such test probes in electrical test fixtures has increased. Today, it is not uncommon for thousands of such probes to be required to test one circuit card. When it is considered that prior art test probes typically cost a dollar or more, the nature of the problem may be appreciated.

Several factors contribute to the undesirable expensiveness of prior art test probes. Prior art miniature probes having retractable tips, particularly those of the plunger type, require a good deal of interior and exterior structural detail on a small scale, leading to expensive assembly and manufacture. In the prior art, these assembly procedures have been complicated by the necessity to assure proper electrical contact between the sliding plunger mechanism and the surrounding tube. To reduce cost, it would be desirable to reduce the number of parts and amount of metal required and to simplify the assembly procedures. At the same time, reusability of the probes must be maintained.

SUMMARY OF THE INVENTION

It is therefore an object of the invention to improve circuit card test equipment.

It is a major object of the invention to cost reduce such test equipment.

It is another object of the invention to provide a cost reduced electrical test probe assembly.

It is another object of the invention to enable testing of more dense contact patterns on the board under test.

It is still another object of the invention to simplify the manufacture and assembly of an electrically effective and reusable test probe.

These and other objects and advantages are achieved according to the invention by utilizing a circuit card test fixture wherein the contact probe bearing baseboard, here after referred to as the probe board, is held in a fixed position with respect to the surface bearing the printed circuit card. The test probes are arranged to normally protrude through a thin sheet material which is inexpensive and easily replaceable. It has been found that in such a system a simple cover sealing membrane overlying the circuit card and flexible enough to be forced down around the circuit card by vacuum force applied to the interior of the test fixture is sufficient to retain the test board on the fixture, despite considerable tolerances in the vacuum tightness of the system. As an additional feature, the circuit test probes and the overlying cover sealing membrane may be constructed to perform a mutually supportive function.

According to another aspect of the invention an electrical test probe is provided including a shaft, a contact cap which slidably fits on one end of the shaft and a spring cooperating with the shaft and cap to connect the cap to the shaft and to provide a force for biasing the cap against a circuit card test point. A simple twist of the cap provides both ease of assembly and electrical continuity between the cap and the shaft. The use of lower force probe spring enables testing of more dense patterns on the board under test.

The number of parts and complexity of the circuit card test apparatus of the subject invention is reduced to a minimum by the above features. A cost reduction on the order of 10:1 over prior art circuit test equipment has resulted from implementation of the subject invention. This savings derives, in part, from a savings in the cost of material which must be scrapped to adapt a tester to a new circuit card.

BRIEF DESCRIPTION OF THE DRAWINGS

The preferred embodiment and best mode for practicing the just summarized invention will be described in the following detailed description taken in conjunction with the drawings of which:

FIG. 3 illustrates the preferred structure of a test probe usable in the preferred embodiment of the invention.

FIG. 4 illustrates an embodiment of a plurality of test probes of FIG. 3.

DETAILED DESCRIPTION OF THE PREFERRED EMBODIMENT

Figure 1:
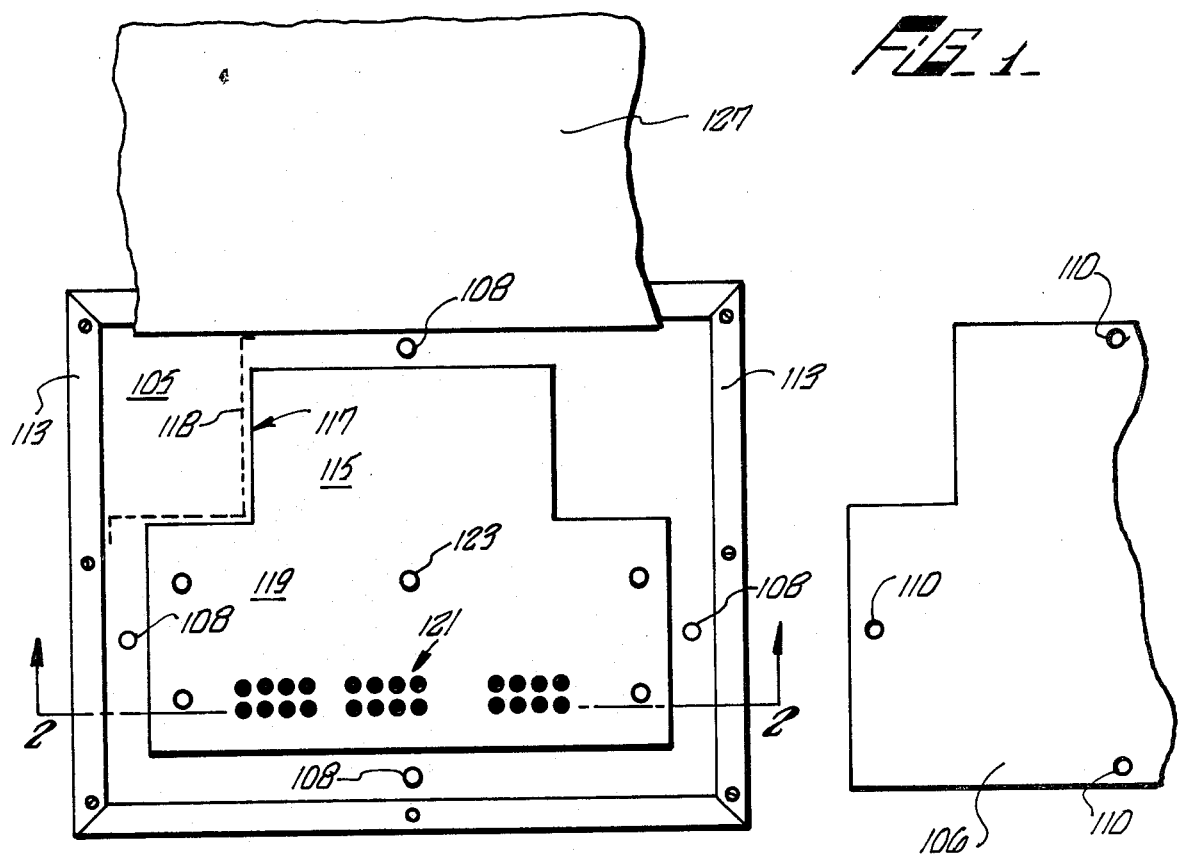
FIG. 1 illustrates a view of the testing surface of a circuit testing fixture according to the preferred embodiment of the invention.
Figure 2:
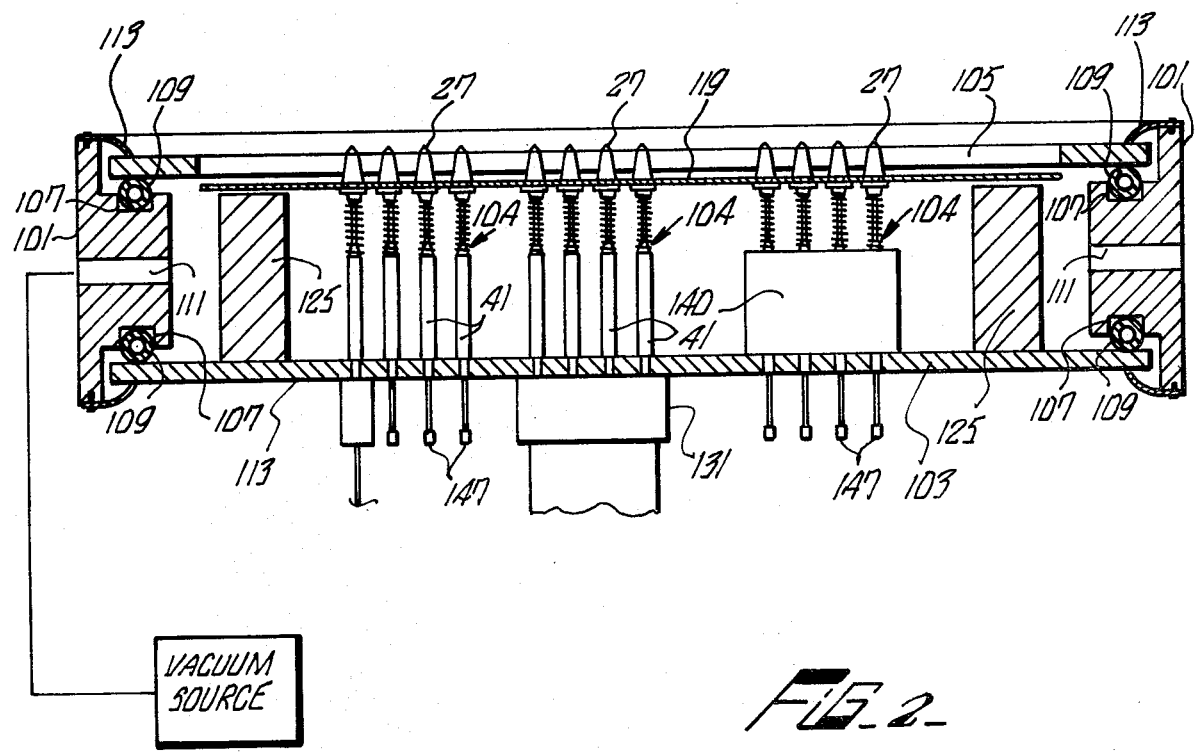
FIG. 2 illustrates a section taken at 2—2 of FIG. 1 illustrating a detailed cross section of the circuit card test apparatus of the preferred embodiment.

The circuit card testing apparatus of the preferred embodiment of the invention is illustrated in FIGS. 1 and 2. The apparatus includes a metal frame 101, a probe board member 103 for mounting a number of electrical test probes 104, and a window board 105 on which a circuit card under test 106 is mounted.

The rectangular vacuum frame 101 includes a pair of channels 107 in which is mounted flexible circular tubing 109. The vacuum frame members 101 also contain suitable apertures 111 for connecting vacuum producing apparatus. The vacuum frame members 101 also mount clamps 113, which loosely position the probe board 103 and the window board 105 on the flexible tubes 109.

The window board 105 has an opening or window, 115 therein defined by the window perimeter 117 large enough to accommodate the test probe pattern necessary for contacting the underside of the circuit card 106. The window perimeter 117 provides a surface on which the card 106 rests, preferably on a small margin as indicated by the dashed line 118.

The window 115 is substantially filled by a flexible plastic sheet 119. As will be detailed further below, the sheet 119 engages each cap 27 of a circuit test probe 104 such that the sheet 119 is supported by the caps 27 just beneath the surface of the bed board 105 and in turn stabilizes the test probes 104 in position. The sheet 119 has suitable openings 121 therein for providing the necessary test probe contact pattern. Larger openings 123 are also provided to facilitate the application of vacuum force to the overlying circuit card. An exemplary thickness for the plastic sheet 119 is on the order of 0.125 inch although thicker or thinner dimensions may be used.

The window board 105 and probe board 103 are preferably both constructed of a phenolic material. If desired, wooden blocks 125 (FIG. 2) may be provided near the window perimeter 117 between the phenolic boards or other insulating material 103 and 105. This structure enables the use of thinner and less expensive phenolic boards.

Finally, a nonconductive plastic cover sealing membrane 127 is mounted on the test apparatus. This cover 127 may be attached to the test fixture by tape or other means. The plastic cover 127 should be large enough to cover a circuit card under test and to overlap its edges and rest on the window board 105. An exemplary thickness for the cover 127 is on the order of 10 to 20 thousandths of an inch.

A vacuum chamber is formed by several of the components just described. The rectangular vacuum frame 101, the flexible circular tubes 109 and the probe board 103 compose one side of the vacuum chamber. The window board 105 is merely an extention of the frame 101. The perimeter of the window 117, the board under test 106 and the cover sealing membrane 127 compose the other side of the vacuum chamber.

In testing a circuit card, the test fixture operates in the following manner. A circuit card is placed on the window board 105, and is properly located by suitable alignment pins, 108 matching alignment holes 110 in the circuit card 106. The nonconducting plastic cover 127 is then turned down over the circuit card 106 where it rests loosely over the card 106 and the window board 105. The probe board 103 and window board 105 are maintained loosely against the flexible tubings 109, but close enough such that when vacuum is drawn from the vacuum hole 111 through a collective manifold, the probe and window boards are forced inwardly against the flexible tubings 109 by the surrounding atmospheric pressure, creating a vacuum seal at the sealing rings formed by the tubing 109. At the same time, the window and probe boards 103, 105 are bowed slightly inwardly towards one another. This inward bowing may be limited by the blocks 125.

As a result of the vacuum force permeating around and through the flexible plastic sheet 119, the plastic sealing membrane cover 127 is sucked tightly down around the circuit card 106 with sufficient force to hold the card 106 in position on the test apparatus. At the same time, the circuit card 106 is pressed against the spring loaded caps of the test probes 104. In this manner, positive electrical contact between the probes and corresponding contact points on the circuit card 106 is established and maintained during testing.

The provision of the flexible plastic sheet 119 in the window 115 on the window board 105 proves a great advantage when it is necessary to change the test probe pattern of the apparatus. In such case, it is only necessary to discard an inexpensive piece of plastic material rather than the relatively expensive phenolic board. In all its aspects, the test apparatus of the preferred embodiment of the invention is configured of inexpensive and easily assembled materials.

As illustrated in FIG. 3, the test probe 104 of the preferred embodiment of the invention is particularly suited to be inserted in a circuit board test fixture apparatus including a probe board 103 and a flexible plastic sheet 119 spaced at a fixed distance from one another. The probe may also be used where the overlying member is a bed board of phenolic or other material. The probe assembly 104 is particularly suited to make contact to an electrical test point 17 on the undersurface of a printed circuit board 19. The probe assembly 104 includes three basic electrically conductive metal members: a shaft 21, a spring 25 and a cap 23.

Contact to the electrical pad 17 is made by means of the cap 23. The cap 23 has a tip 27 of a length suitable to protrude through the flexible plastic sheet 119 to make contact with the test points of the overlying circuit card. The length of protrusion of the cap 23 is limited by a flange 29, which abuts the underside of the surface through which the cap 23 protrudes. The rear portion 31 of the cap 23 is tapered to engage the end of the spring 25. Finally, the cap 23 has an interior bore 33 for mounting to the pin 35.

The tip 27 of the cap 23 has a beveled point 28 which aids in centering the tip 27 to pass through the flexible plastic sheet 119. To maintain the probe 104 in position and support the sheet 119, a circumferential indent 26 is made in the cap. The sheet 119 then snaps over and interlocks with the cap 23.

The cylindrical shaft 21 has an integrally formed pin 35 on which the bore 33 of the cap 23 is slideably mounted. The end 36 of the shaft 21 opposite the cap 23 is tapered down from a diameter larger than that of the spring 25 to a diameter onto which the spring 25 easily slides.

The spring 25 is of a length and tension which biases the flange of the cap 23 toward the underside of the circuit card under test. The spring action provides compensation for dimensional tolerances of the printed circuit board and associated test points. The respective ends of the spring 25 consist of one or more dead coils whose ends 37, 39 are closed, squared and unground. These ends 37,39 press fit with the tapered surfaces 31, 36 of the cap 23 and the shaft 21.

The spring constant utilized in the preferred embodiment is on the order of 20 grams per $10^{-4}$ inch. This constant is much smaller than that typical in the prior art. It enables high density pin configurations to be used with a lesser degree of evacuation, while still maintaining effective contact between circuit card contact points and test probes. An effective pressure of ⅝ atmospheric and even less can be safely accomodated in this manner.

The cooperation of the tapers 36, 31 and the spring 25 performs the important dual function of physically connecting the cap 23 to the pin 35 and providing electrical contact between the cap 23 and the pin 35. To positively attach the cap 23 to the pin 35 and provide electrical contact the cap 23 is simply pushed on the end of the pin 35 into the spring 25 and given a slight twist counterrotative to the helix of the spring 25. This twisting action causes the closed ends 37, 39 of the spring 25 to ride up on the tapers 31, 36 and attach securely thereto. This simple twist action provides for ease of assembly and positive electrical contact with a minimum number of parts.

The rear portion of the shaft 21 includes a number of cylindrical surfaces symmetric about a common axis, which provide mounting and electrical connection functions. The pin 35 of the shaft 21 forms integrally into a mounting flange 41, which abuts the interior surface of the probe board 103. For economy, the mounting flange diameter is that of the stock from which the pin is formed. This flange 41 retains the pin at a proper distance in the interior and lends support to the probe assembly. The upper rim of the flange 41 constitutes a mounting shoulder 42, to which the force of a pin insertion tool is applied to press-fit insert the pins into the probe board 103. Integrally formed with the mounting flange 41 is a smaller cylindrical surface 43, which is pressure-fitted in an aperture 44 in the probe board 103. Finally, a cylindrical connecting pin 45, terminating in a lock nut 47, extends from the pressure fit surface 43 to receive an electrical connector from test analyzing equipment.

An advantageous embodiment for using the test probes of the preferred embodiment of the invention is illustrated in FIG. 4. As there shown, a number of test probes 104 of the preferred embodiment, for example eight, are encased in a phenolic module 140. The stock diameter mounting flange 43 alone is encased in the phenolic module 140 such that the rest of the functional parts of the circuit probe are exposed. To obtain the maximum advantage from this structure, the probes 104 are spaced in the module 140 to match standard test point configurations presented by circuit cards. Thus, when it is necessary to install pins in a probe board 103 (FIG. 2), a module 140 is simply plugged in on top of the probe board 103 such that the connecting pins 45 are exposed. This results in a tremendous saving in assembly time and cost. FIG. 2 illustrates such a module 140 in position.

FIG. 2 also illustrates another advantageous assembly feature facilitated by the subject invention. This feature resides in the use of block connectors 131 to interface with the socket receiving surfaces. In this manner, a great increase in assembly efficiency is achieved.

At this point a simple, effective and economical circuit test apparatus has been disclosed in detail including an easily assembled, insertable and reusable electrical probe assembly. As may be apparent many modifications and adaptations may be made in the above described preferred embodiment by those of ordinary skill in the art without departing from the scope and spirit of the invention. Therefore, it is to be understood that, within the scope of the appended claims, the invention may be practiced other than as specifically described.

What is claimed is:

1. In an electrical circuit card testing fixture including a chamber including a lower surface bearing a plurality of test probes, and an upper surface for bearing a circuit card under test, the structure comprising:
    an opening in said upper surface located over the area of said test probes;
    a thin, flexible plastic sheet located in said opening and
    having a plurality of apertures; each one of at least a majority of said test probes being inserted into and penetrating through one of said apertures whereby a positioning of said test probes is stabilized, and
    a plastic sealing membrane for covering a circuit card under test placed over said opening and responsive to evacuation of said chamber to collapse around said circuit card to hold said circuit card in test position.

2. The structure of claim 1 wherein a plurality of said test probes are mounted in a single module for simultaneous insertion into said lower surface.

3. An electrical circuit card test fixture comprising:
    a first test probe bearing surface;
    a second circuit card bearing surface having an opening therein;
    means for supporting said first and second surfaces spaced apart from one another thereby forming a housing;
    a plurality of electrical test probe means mounted in said first surface and having tips biased to normally protrude slightly above said second surface; and
    a membrane for covering said circuit card and responsive to the evacuation of said housing to collapse around said circuit card to hold said circuit card in test position against said test probes.

4. An electrical circuit card test fixture comprising:
    a first test probe bearing surface;
    a second circuit card bearing surface having an opening therein;
    means for supporting said first and second surfaces spaced apart from one another thereby forming a housing;
    a plurality of electrical test probe means mounted in said first surface and having tips biased to normally protrude slightly above said second surface, each said tip having an indentation therein;
    means in said opening for interlocking with said indentations to stabilize the relative positioning of said test probe means; and
    a membrane for covering said circuit card and responsive to the evacuation of said housing for collapsing around said circuit card to hold said cricuit card in test position against said test probes.

* * * * *